United States Patent [19]
Leong et al.

[11] Patent Number: 6,122,706
[45] Date of Patent: Sep. 19, 2000

[54] DUAL-PORT CONTENT ADDRESSABLE MEMORY

[75] Inventors: Raymong Leong, Los Altos; Gary Green, San Jose, both of Calif.

[73] Assignee: Cypress Semiconductor Corporation, San Jose, Calif.

[21] Appl. No.: 08/172,575

[22] Filed: Dec. 22, 1993

[51] Int. Cl.$^7$ .................................................. G06F 12/14
[52] U.S. Cl. ........................... 711/108; 365/49; 709/245; 709/250; 710/129; 710/130; 710/48; 710/107; 710/113; 710/119; 711/149; 711/150; 711/151; 711/152; 711/158; 711/168; 711/169
[58] Field of Search .................... 365/49; 709/250, 709/245; 710/129, 130, 107, 113, 119, 48; 711/108, 151, 158, 128, 131, 149, 150, 152, 168, 169

[56] References Cited

U.S. PATENT DOCUMENTS

| | | | |
|---|---|---|---|
| 4,423,384 | 12/1983 | De Bock | 327/19 |
| 4,888,731 | 12/1989 | Chuang et al. | 365/49 |
| 4,890,260 | 12/1989 | Chuang et al. | 365/49 |
| 4,928,260 | 5/1990 | Chuang et al. | 365/49 |
| 4,937,781 | 6/1990 | Lee et al. | 711/149 |
| 5,115,411 | 5/1992 | Kass et al. | 365/189.01 |
| 5,136,580 | 8/1992 | Videlock et al. | 370/403 |
| 5,163,132 | 11/1992 | Dulac et al. | 710/53 |
| 5,226,005 | 7/1993 | Lee et al. | 365/49 |
| 5,247,620 | 9/1993 | Fukuzawa et al. | 709/245 |
| 5,276,842 | 1/1994 | Sugita | 711/149 |
| 5,329,618 | 7/1994 | Moati et al. | 709/245 |
| 5,343,471 | 8/1994 | Cassagnol | 370/401 |
| 5,410,652 | 4/1995 | Leach et al. | 370/450 |
| 5,481,540 | 1/1996 | Huang | 370/401 |

Primary Examiner—Hiep T Nguyen
Attorney, Agent, or Firm—Blakely, Sokoloff, Taylor & Zafman LLP

[57] ABSTRACT

A CAM including a set of priority registers for storing information from one port and a set of non-priority registers for storing information from a second port. The CAM also includes a memory array that is coupled to both sets of registers. A port arbiter within the CAM determines which set of registers is given access to the memory array. Also described is a method for controlling access to the memory array. A lock interval is indicated before the priority registers initiate access to the memory array. During the lock interval, access to the memory by the non-priority registers is delayed if the access cannot be completed before the priority registers begin access.

26 Claims, 8 Drawing Sheets

Fig. 4
(FOR 48-BIT ADDRESSES)

DUAL-PORT CONTENT ADDRESSABLE MEMORY

FIELD OF THE INVENTION

The present invention relates to bridge devices within computer networks. More particularly the present invention relates to content addressable memory (CAM) devices used in bridges.

BACKGROUND OF THE INVENTION

Networks typically connect a number of workstations. Networks can be linked together by a bridge. When a workstation wishes to transmit information to another workstation in the same network, it can transmit the information directly without going through a bridge. However, a bridge must be used when a workstation in one network wishes to transmit information to a work station in another network.

As the number of workstations within a network increases so does the volume of transmission traffic within the network and between networks. To minimize the volume of transmission traffic, a prior bridge may be used. The prior bridge minimizes transmission traffic between the linked networks by monitoring all transmissions and passing through only those transmissions between workstations of different networks. To accomplish this, the prior bridge maintains a list of workstation addresses, which the prior bridge checks every time it receives a transmission. One method of checking the workstation address list is a sequential comparison of each workstation address in the list with the destination address of the transmission. Another and faster method of checking the workstation address list is a parallel comparison of workstation addresses using a content addressable memory (CAM). The (CAM) simultaneously checks the transmission address against all workstation addresses it stores.

Figure 1:
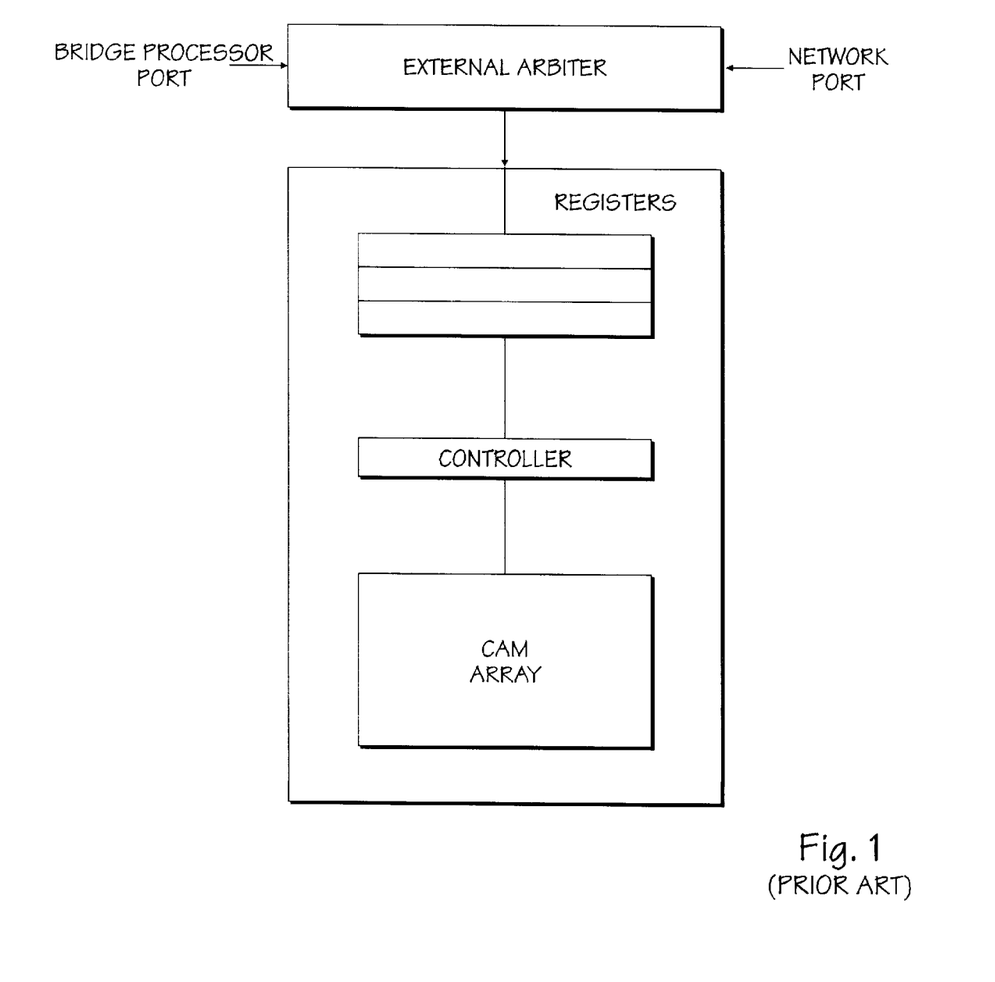
FIG. 1 is a block diagram of a prior CAM.

One prior CAM includes a CAM array, an internal controller and a set of registers, as shown in FIG. 1. The prior CAM includes a single port for accessing the CAM. The external arbiter arbitrates access to that port by the network and the bridge processor, which maintains the list of workstation addresses stored within the CAM. The external arbiter gives the network priority access to the CAM port because the network cannot postpone its transmission. If the bridge processor and network seek access to the CAM port at the same time, the external arbiter denies the bridge processor access. The external arbiter also denies the bridge processor access to the CAM port if the network already has access to the CAM port. Additionally, if the bridge processor is in the process of loading its registers and the network seeks access, the external arbiter interrupts the bridge processors access. Because the prior CAM includes only one set of registers, interruption causes the information written into the registers by the bridge processor to be overwritten by the network. As a result, the bridge processor must reload the registers when it regains access to the CAM port. This decreases bridge performance.

SUMMARY OF THE INVENTION

An object of the present invention is to decrease design complexity of bridges utilizing CAMs.

Another object of the present invention is to increase bridge performance by eliminating network overwrites of bridge processor data.

A CAM is described that includes one set of registers for storing data from one device and a second set of registers for storing data from a second device. The CAM also includes a memory array, which is coupled to the two sets of registers. A port arbiter within the CAM determines which set of registers is given access to the memory array and gives priority to one set of registers over the other. Even though one set of registers is given priority, access to the memory array by the other set of registers is affected only when its access cannot be completed prior to initiation of access by the set of priority registers. As a result, the impact of priority upon the non-priority registers is minimal. Also described is a method for controlling access to the memory array. A lock interval is established before the priority registers initiate access to the memory array. During the lock interval, access to the memory array by the non-priority registers is delayed if the access cannot be completed before the priority registers begin access.

Other objects, features, and advantages of the present invention will be apparent from the accompanying drawings and the detailed description that follows.

BRIEF DESCRIPTION OF THE FIGURES

The present invention is illustrated by way of example and not limitation in the figures of the accompanying drawings in which references indicate similar elements and in which.

DETAILED DESCRIPTION

Figure 2:
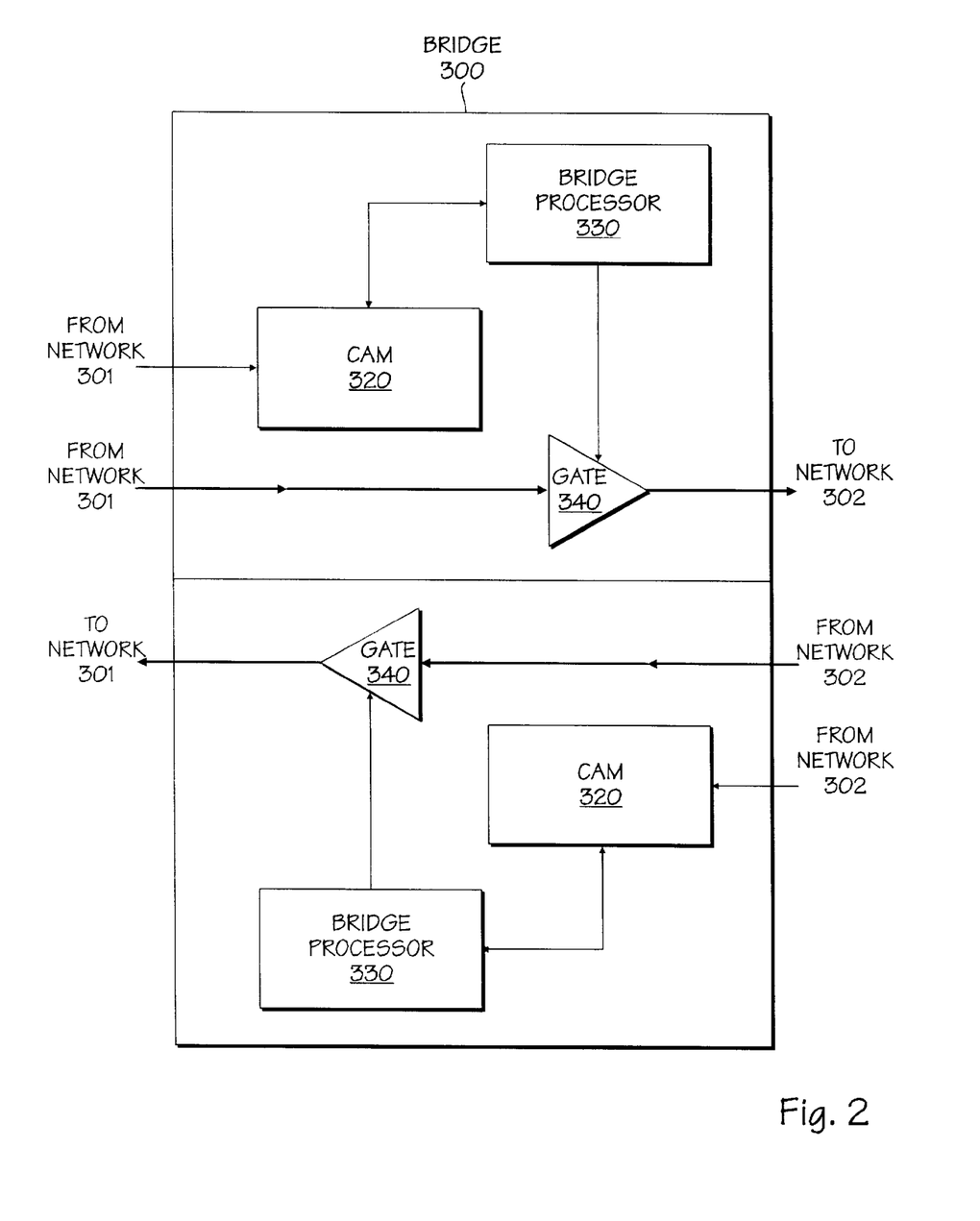
FIG. 2 is a block diagram of a bridge including two CAMs.

FIG. 2 illustrates in block diagram form bridge 300. Bridge 300 transfers information between two networks 301 and 302 (not illustrated) using bridge portions 310 and 360. Bridge portion 310 determines whether transmission from network 301 should be passed through to network 302 and bridge portion 360 determines whether transmissions from network 302 should be passed through to network 301. Each bridge portion 310 and 360 makes its decisions by comparing the destination workstation address of each transmission to a list of workstation addresses stored in CAM 320 of the present invention. As will be described in detail below, each CAM 320 includes two ports, one servicing bridge processor 330 and one servicing a network 301 or 302. Each port includes a set of registers which is used to store data relating to the access of the CAM array. The workstation address received from the network is one example of such data. Commands are another example. This feature allows CAM 320 to store data from both bridge processor 330 and a network 301 or 302, thereby eliminating the need to reload data, which may require multiple writes to complete. In addition, CAM 320 includes an internal port arbiter, which arbitrates access to the CAM array by the two sets of registers and eliminates the need for an external arbiter.

Bridge 300 minimizes the volume of transmissions between networks 301 and 302 by only allowing to pass through transmissions between a workstation of network 301 and a workstation of network 302. Bridge 300 decides which transmissions to pass through by monitoring the destination address included in each transmission and using either a "pass on match" or "pass on miss" protocol. The destination address is a unique address specifying the recipient workstation of the transmission. Bridge 300 compares each destination address to a list of workstation addresses it maintains. The workstations included in the list of addresses depends upon whether bridge 300 implements a pass on match or a pass on miss protocol.

When a pass on match protocol is implemented CAM 320 of bridge portion 310 stores workstation addresses of all the workstations within network 302. Bridge 300 then allows transmissions from network 301 to pass through to network 302 when the transmissions include a destination address which matches an address stored within CAM 320 of bridge portion 310. Analogously, CAM 320 of bridge portion 360 stores workstation addresses for all the workstations within network 301. Bridge 300 allows transmissions from network 302 to pass through to network 301 when they include destination addresses matching addresses stored within CAM 320 of bridge portion 360. Each bridge processor 330 responds to a match signal by enabling gate device 340. Gate device 340 then allows the transmission to pass through bridge 300 to the other network.

In contrast to the pass on match protocol, when a pass on miss protocol is used CAM 320 of bridge portion 310 stores a list of all workstations outside of network 302. If CAM 320 indicates that a destination address matches none of the addresses it stores, then bridge processor 330 assumes the transmission is intended for network 302. Bridge processor 330 responds by enabling pass gate 320 to pass the transmission to network 302. Bridge portion 360 operates analogously when bridge 300 uses a pass on miss protocol.

Bridge processor 330 serves other functions also. Bridge processor 330 maintains the list of workstation addresses stored within CAM 320. Bridge processor 330 adds addresses of recently activated or installed workstations and removes addresses of inactive workstations or workstations no longer existing in network 301 or 302.

CAM 320 compares an address presented via one of the two ports to its entire list of workstation addresses simultaneously. This simultaneous comparison is possible because every memory cell in the CAM array has its own comparator and performs comparisons independently of the other memory cells. When any workstation address within CAM 320 matches the externally presented address, CAM 320 brings the match signal active.

Figure 3:
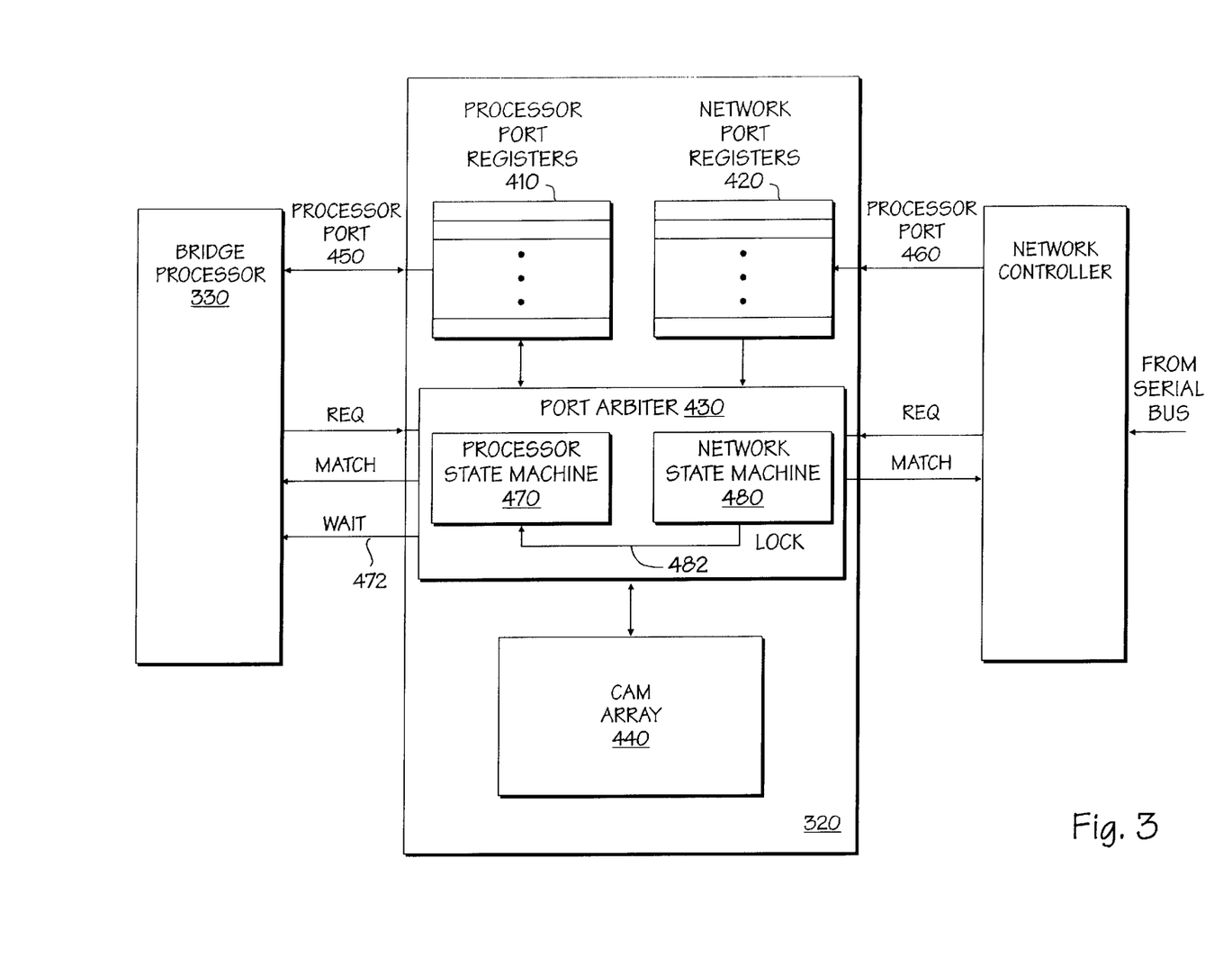
FIG. 3 is a block diagram of a CAM.

FIG. 3 illustrates in block diagram form CAM 320. CAM 320 includes processor port registers 410, network port registers 420, port arbiter 430, and CAM array 440. Processor port registers 410 store data from bridge processor 330 for subsequent use by CAM array 440. Network port registers 420 on the other hand, store data from network 301 or 302 for subsequent use by CAM array 440. Port arbiter 430 arbitrates access to CAM array 440 by registers 410 and 420 because CAM array 440 can only perform one operation at a time. Finally, CAM array 440 stores the addresses of all active workstations within one network linked to bridge 300.

Addresses input to CAM array 440 can come from either processor port registers 410 or network port registers 420. In one embodiment, registers 410 and 420 each store 48 bit addresses, which are loaded 16 bits at a time. Each 16 bit load into registers 410 or 420 is accompanied by an active request signal, req. Thus, storing an address into registers 410 and 420 requires three loads. However, CAM 320 of the present invention is not affected by the total number of bits stored by registers 410 and 420, nor by the number of bits loaded into them at one time.

If port arbiter 430 allows, CAM array 440 begins comparing an address from registers 410 or 420 at the beginning of the final address load. In other words, access to CAM array 440 begins at the end of the final address load. In the embodiment in which 48 bit addresses are loaded 16 bits at a time into registers 410 and 420, access to CAM array 440 begins at the end of the third address load.

Port arbiter 430 allows access to CAM array 440 according to the following rule: network access over bridge processor 330 access. When the network wishes access to CAM array 440, it receives access. Bridge processor 330 on the other hand, is given access only when the network is not trying to access CAM array 440. In fact, if the network tries to access CAM array 440 while bridge processor 330 is preparing to do so, port arbiter 430 interrupts bridge processor access unless it can be completed before the network port begins its access to CAM array 440. Port arbiter 430 signals interruption of bridge processor access via an active wait signal 472. Port arbiter 430 then gives access to the network. If bridge processor 330 tries to access CAM array 440 while the network is doing so, port arbiter 430 also brings wait signal 472 active. Thus, bridge processor 330 is prevented from accessing CAM array 440 until the network has completed its access.

Port arbiter 430 accomplishes its function using two state machines: processor state machine 470 and network state machine 480. Both state machines 470 and 480 are preferably implemented using programmable logic arrays (PLAs) although hard-wired logic implementations are also feasible. Network state machine 480 monitors transmissions from the network and asserts lock signal 482 at the appropriate time to ensure that the network access to CAM array 440 is not interrupted. Network state machine 480 deasserts lock signal 482 after the network completes its access. Processor state machine 470 monitors bridge processor 330 and asserts wait signal 472 when bridge processor 330 seeks access to CAM array 440 while lock signal 482 is active.

Figure 4:
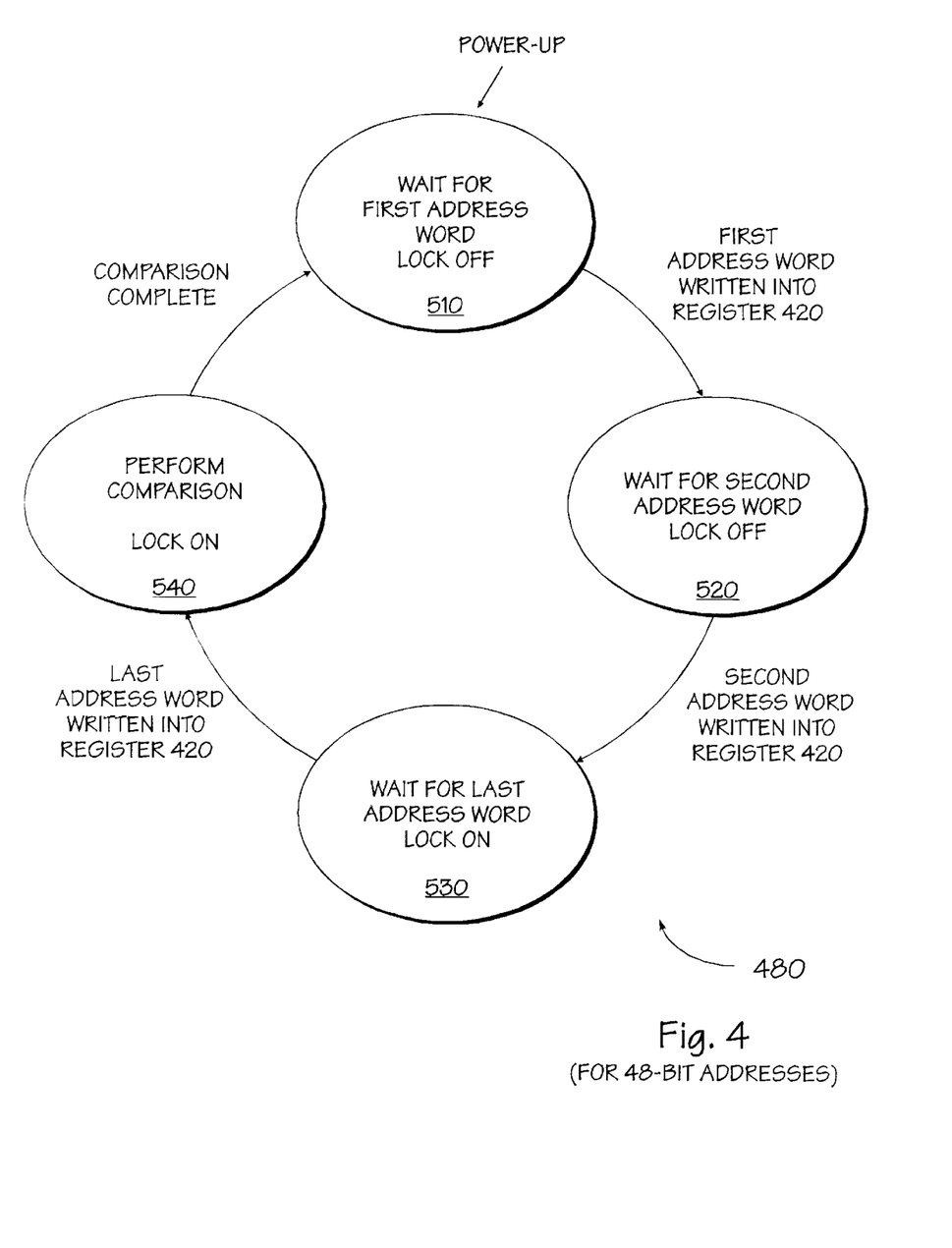
FIG. 4 is a state diagram illustrating the operation of the network state machine.

FIG. 4 is a state diagram illustrating the operation of network state machine 480 in an embodiment which uses 48-bit addresses and loads them to the network port 16 bits at a time. Network state machine 480 monitors the loading of address words into registers 420 and asserts lock signal 482 at the appropriate time to ensure that network access to CAM array 440 is not interrupted. Network state machine 480 deasserts lock signal 482 when CAM array 440 has completed comparing the address from registers 420 to addresses within CAM array 440.

Network state machine 480 powers up in state 510. During state 510 lock signal 482 is inactive and network state machine 480 awaits the loading of the first 16-bit address word into registers 420.

Network state machine 480 transitions from state 510 to state 520 when the first 16-bit address word is written into network port registers 420. During state 520 network state machine 480 awaits the writing of the second 16 bit address word into network port registers 420. Network state machine 480 holds lock signal 482 inactive during state 520. When the second address word is written into network port registers 420, network state machine 480 branches to state 530 from state 520. As with states 510 and 520, during state 530 network state machine 480 waits for another address word to be written into network port registers 420. In this embodiment, state machine 480 asserts lock signal 482 during state 530.

Whether or not lock signal 482 is asserted during step 530 depends upon the number of address words included in an address, the specified amount of time between the start of transmission of one address word and start of transmission of the next address word, the time duration of each address word and the time required by CAM array 440 to perform a comparison. In one embodiment, only 160 nanoseconds may elapse between the transmission of one address word and the next address word, and CAM array 440 takes 80 nanoseconds to perform a comparison. Thus, ensuring that network port registers access to CAM array 440 will not be impeded by registers 410 requires asserting lock signal 482 as soon as the next to the last address word is loaded into network processor ports 420. Accordingly, in systems using 48-bit addresses which are loaded 16 bits at a time, lock signal 482 will be asserted as soon as the second address word is loaded into network port registers 420. Similarly, in systems using a 64-bit addresses, which are loaded into network port registers 420 16 bits at a time, lock signal 482 is asserted as soon as the third address word is loaded into network port registers 420. In systems with a higher ratio between time that may elapse between transmission of address words and time required to perform the address comparison, lock signal 482 may be brought active later.

Assuming that workstation addresses are 48 bits long, are loaded into registers 410 and 420 16 bits at a time and that CAM array 440 requires 80 nanoseconds to perform a comparison, network state machine 480 will bring lock signal 482 active in state 530. Receipt of the final address word causes network state machine 480 to transition to state 540. In state 540, network state machine 480 couples the address stored in network port registers 420 to CAM array 440 and address comparison begins. During state 540, network state machine 480 continues to hold lock signal 482 active to prevent any access by registers 410 that would disturb the comparison in process. Network state machine 480 remains in state 540 until CAM array 440 completes its comparison. Network state machine 480 then returns to state 510 to await the start of another address comparison cycle. Lock signal 482 returns inactive in state 510.

Figure 5:
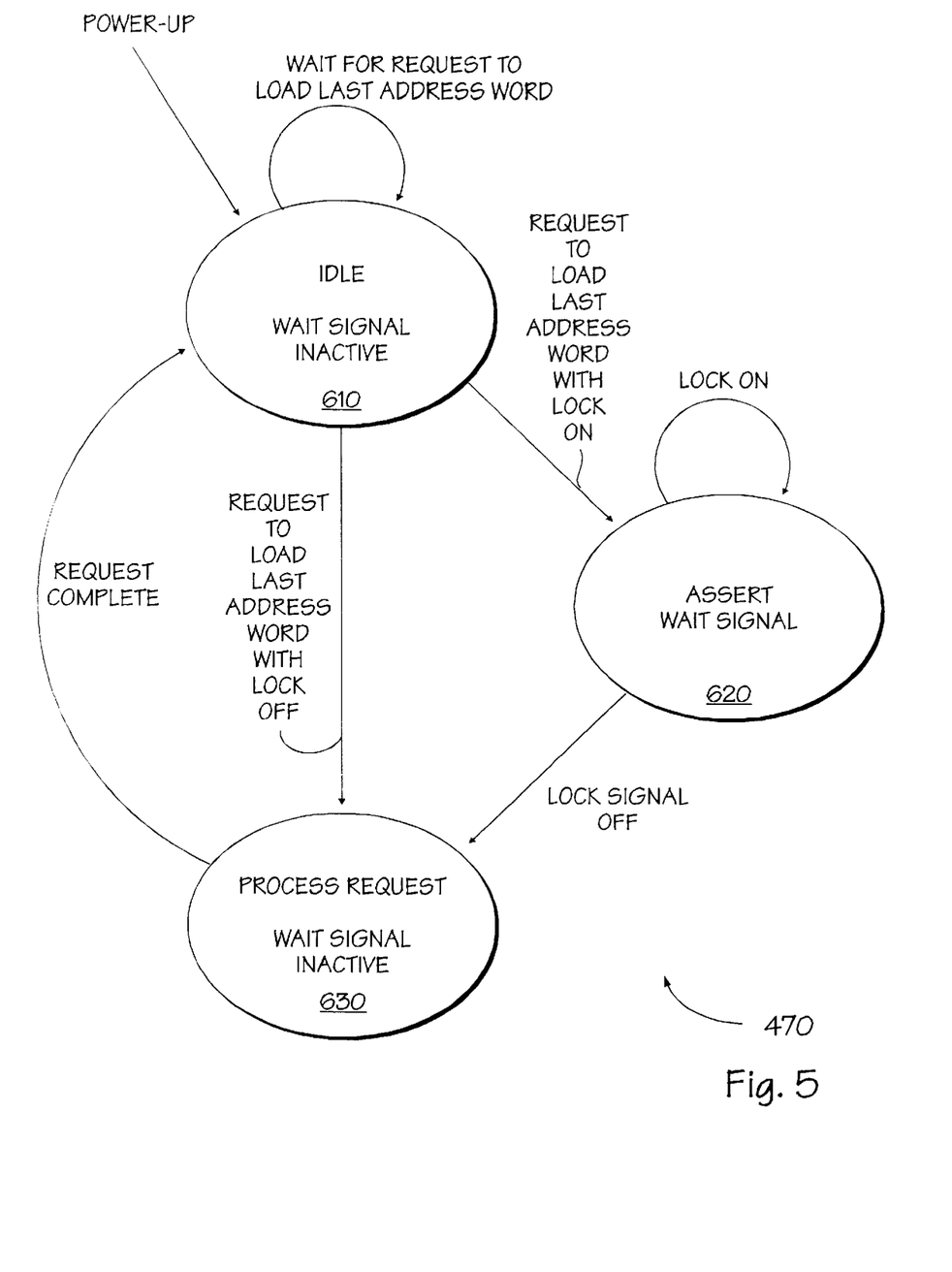
FIG. 5 is a state diagram illustrating the operation of the processor state machine.

The state diagram of FIG. 5 illustrates the operation of processor state machine 470. Processor state machine 470 prevents bridge processor 330 from interfering with access from the network by asserting wait signal 472 if bridge processor 330 tries to access CAM array 440 while lock signal 482 is active. In all other instances, processor state machine 470 allows bridge processor 330 to load processor port registers 410 and access CAM array 440 as it desires.

Processor state machine 470 powers up in state 610. During state 610 processor state machine 470 awaits the loading of the last address word of an address into registers 410 and keeps wait signal 472 inactive. Processor state machine 470 remains in state 610 until bridge processor 330 requests to load the last address word of an address into registers 410. In this situation, processor state machine 470 can take one of two possible branches out of state 610. If bridge processor 330 transmits a request to load the last address word while lock signal 482 is off, or inactive, processor state machine 470 transitions to state 630 from state 610. During state 630, processor state machine 470 keeps wait signal 472 inactive and bridge processor 330 is allowed to load the last address word into registers 410. This allows CAM array 440 to begin comparing the contents of registers 410 to its list of addresses. After the last address word is loaded, processor state machine 470 transitions back to state 610. On the other hand, if bridge processor 330 issues a request to transmit the last address word while lock signal 482 is active, processor state machine 470 transitions to state 620 from state 610. Wait signal 472 is asserted in state 620, preventing bridge processor 330 from loading the last address word into registers 410 and accessing CAM array 440. Processor state machine 470 remains in state 620 while lock signal 482 is still active. Because bridge processor 330 cannot complete the loading of the entire address into registers 410, bridge processor 330 cannot access CAM array 440. Processor state machine 470 branches from state 620 when lock signal 482 returns inactive; i.e., when CAM array 440 has completed the comparison requested by registers 420. Processor state machine 470 then transitions from state 620 and through states 630 and 610 as discussed previously.

Note that wait signal 472 has no effect upon bridge processor 330 access to registers 410 during the loading of all but the last address word of the complete address. Thus, bridge processor 330 is able to prepare for access to CAM array 440 while the network also prepares to access CAM array 440. The effect of active wait signal 472 upon bridge processor 330 is just an interruption of the loading of registers 410. As soon as wait signal 472 returns inactive, bridge processor 330 is free to resume loading registers 410 at the point it left off, rather than beginning to load the registers 410 all over again. The longer the workstation address that must be compared, the greater the advantage to bridge processor 330 from simply resuming the loading of registers 410 from the point of interruption.

Figure 6A:
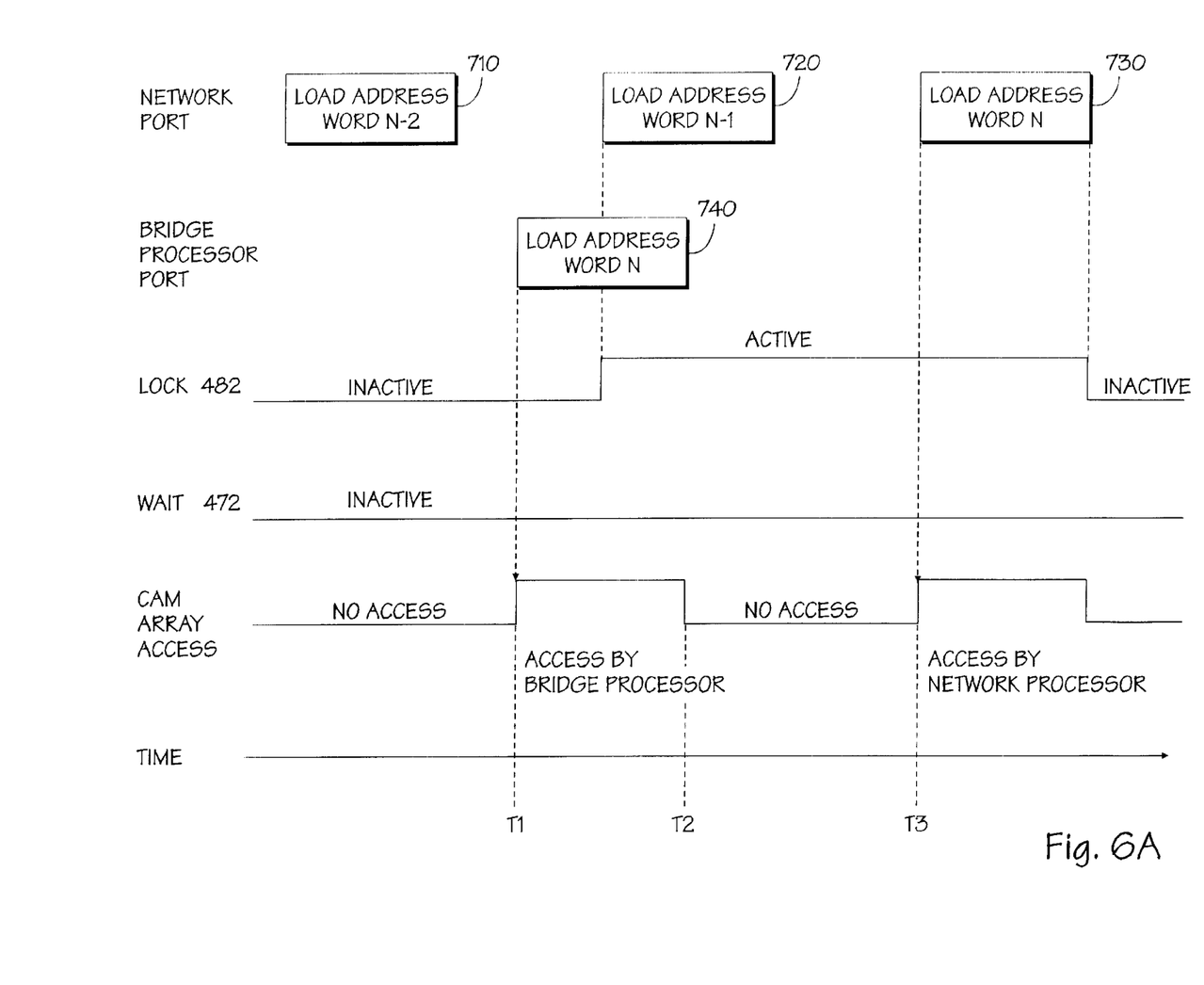
FIG. 6A illustrates the operation of the port arbiter in one situation.
Figure 6B:
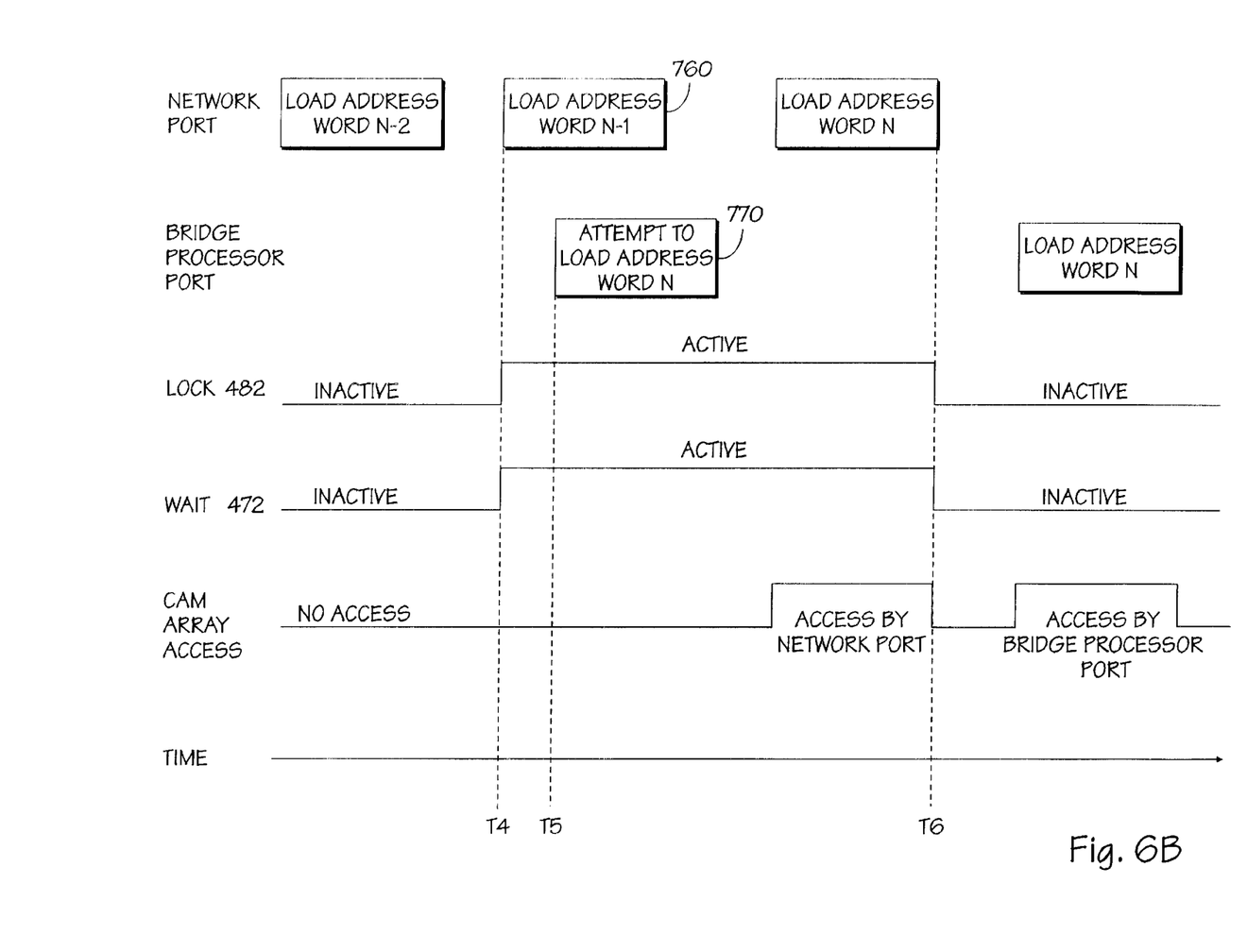
FIG. 6B illustrates the operation of the port arbiter in a second situation.

FIGS. 6A and 6B illustrate the interaction between processor state machine 470 and network state machine 480 in two situations. FIG. 6A illustrates the situation when access by processor port registers 410 to CAM array 440 can be safely completed even though access by network port registers 420 is impending. Bridge processor 330 loads the last address word 740 of an address into registers 410 at time $t_1$. At $t_1$ the network has not yet loaded the second to the last address word 720 of an address into registers 420. As a result, lock signal 482 is inactive, which holds wait signal 472 inactive. Processor port machine 470 responds to this situation by allowing registers 420 access to CAM array 440 at $t_1$. In this situation, CAM array 440 is able to complete its comparison at $t_2$ before network port requires access at $t_3$. Thus, allowing registers 410 to access CAM array 440 has no impact upon the impending access by registers 420 to CAM array 440.

FIG. 6B illustrates the situation when access by registers 410 to CAM array 440 is interrupted by an access by registers 420. The network port begins loading the second to the last address word 760 into registers 420 at time $t_4$. Network state machine 480 responds by bringing active and holding active lock signal 472 until CAM array 440 completes its comparison at time $t_6$ of the address stored in registers 420 to the addresses stored in CAM array 440. Bridge processor 330 is prevented from accessing CAM array 440 between $t_4$ and $t_6$. Thus, when bridge processor 330 attempts to load the last word 770 of a workstation address into registers 410 at $t_5$, processor state machine 470 asserts wait signal 472. Processor state machine 470 holds wait signal 472 active until lock signal 482 returns inactive at time $t_6$. Processor state machine 470 allows bridge processor 330 to load the last address word into registers 410 and access CAM array 440 as soon as lock signal 482 returns inactive by bringing wait signal 472 inactive also. Bridge processor 330 may then load final address word 780 into registers 410 and access CAM array 440.

Figure 7:
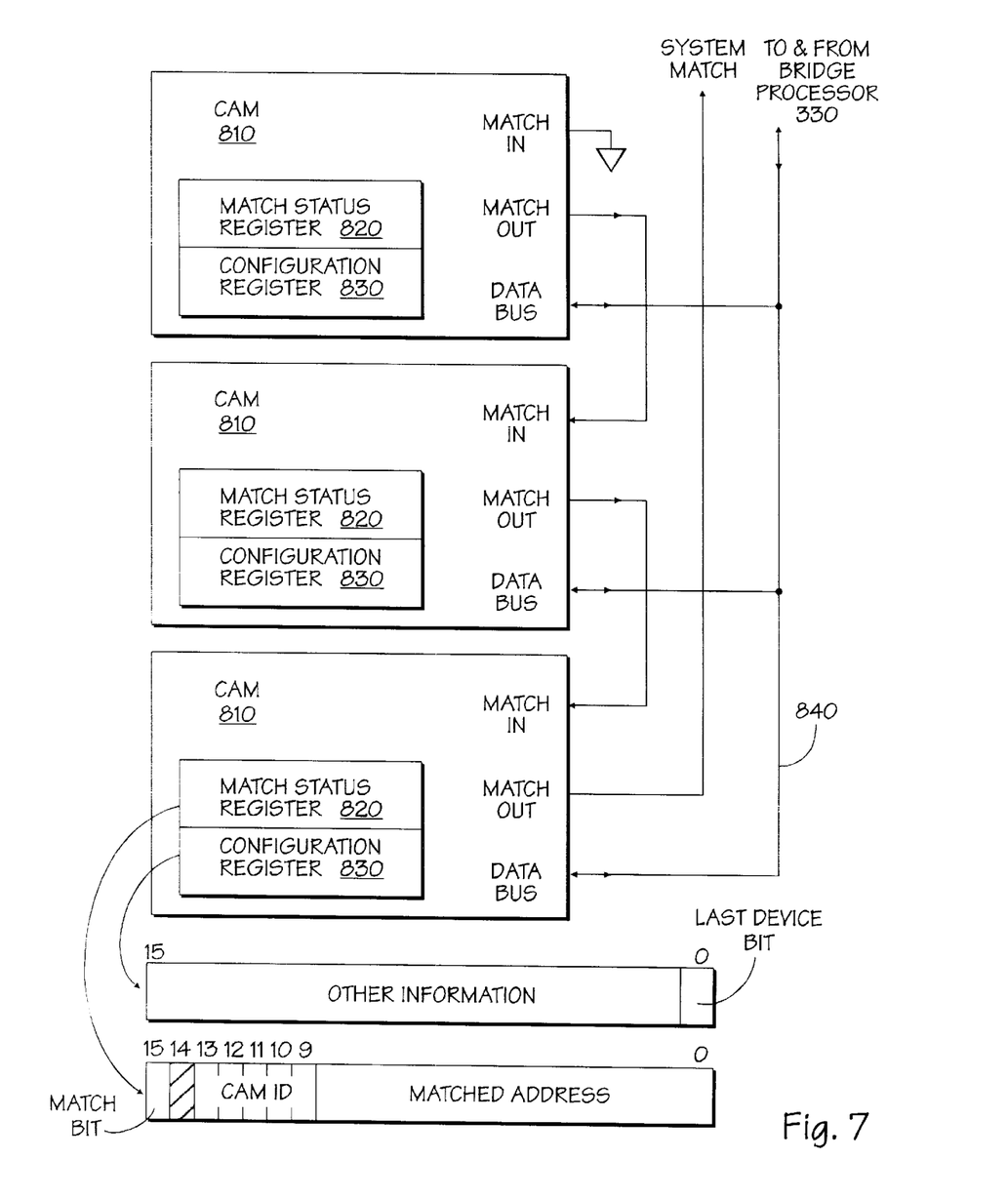
FIG. 7 illustrates a daisy chain of CAMs and the format of the match status register.

In an alternative embodiment of the present invention, CAMs can be coupled in series with each other in a bridge to increase the number of addresses stored by the bridge. FIG. 7 illustrates a number of serially coupled, or daisy chained, CAMs 810. The configuration of FIG. 7 is called a daisy chain because the MATCH output of each CAM 810 is input to the MATCH input of an adjacent CAM 810. The match output of each CAM is a logical OR of its match input signal and its internal match signal. As a result, each CAM 810 is aware of whether one of the CAMs 810 preceding it in the daisy chain stores an address matching that input from registers 410 or 420. The advantage of this will be apparent in the following discussion.

The address stored in registers 410 or 420 of each CAM 810 in the daisy chain is compared against the contents of its own memory array. More than one CAM 810 may find a match and bring its MATCH output active. However, when the CAMs 810 are asked to identify which one of them has the matching address, only one CAM 810 responds. That CAM 810 is the first CAM 810 that has a match. For example, if both CAM A and CAM B of FIG. 7 have a match, only CAM A will respond to the identify request. Similarly, if both CAM B and CAM C have a match only CAM B will respond to the identify request. The first CAM storing a match responds to the identify request by driving the contents of its match status register 820 onto data bus 840.

In one embodiment, match status register 820 includes 16 bits. The most significant bit is a match bit, which indicates whether the CAM stores a matching address. Match status register 820 also stores a 4 bit CAM ID, which uniquely identifies the CAM among a daisy chain containing up to 16 CAM 810. The remaining bits within match status register 820 store the internal address of the matching CAM location.

It is possible that no match will be found within any CAM of the daisy chain. In that case, no CAM drives its match output active. To verify that there is in fact no matching address an identify request is sent to the CAMs. Only one CAM 810 responds to this identify request, the last CAM in the daisy chain. The last CAM in the daisy chain determines that it should respond to the identify request based on two facts. First, the last CAM knows that it is the last CAM. This is because each CAM includes a configuration register 830. Configuration register 830 includes a last device flag, or L bit, which is only set in the last CAM of the daisy chain. Second, the last CAM knows that no CAM in the daisy chain includes a match because it does not include a match and it match input is inactive. Thus, the last CAM drives the contents of its match status register onto the data bus, which indicates there is no match by setting the match bit inactive.

Thus, a CAM 810 has been described that includes two sets of registers, an internal port arbiter and a CAM array. The internal port arbiter ensures the network access to the CAM array without delay. The port arbiter delays bridge processor access to the CAM array if necessary. Because the CAM includes two sets of registers, the network port will never overwrite the bridge port registers. Therefore, the bridge processor need not reload the processor port registers after a preemption by the network port.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of arbitrating access to a memory array within a content addressable memory (CAM), the CAM including a first port and a second port each coupled to the memory array, the method comprising the steps of:

a) indicating a lock interval at a first time prior to the first port initiating access to the memory array; and b) preventing access to the memory array by the second port if that access is to be initiated at a second time after indication of the lock interval and if that access cannot be completed before the first port is to initiate access to the memory array.

2. The method of claim 1 wherein the second port comprises a plurality of registers and preventing access to the memory array comprises preventing the loading of a last of the registers while the first port is accessing the memory array.

3. In a content addressable memory (CAM) including a first port, a second port, and a memory array, a method of arbitrating access to the memory array comprising the steps of:

a) bringing a first control signal active prior to the first port initiating access to the memory array;

b) while the first control signal is active bringing a second control signal active if the second port indicates intent to access the memory array and that access cannot be completed before the first port is to initiate access to the memory array.

4. The method of claim 3 further comprising the step of:

c) bringing the second control signal inactive if the second port initiates access to the memory array while the first control signal is inactive.

5. The method of claim 3 wherein loading of the second port is prevented while the second control signal is active.

6. The method of claim 5 wherein the loading of the second port is prevented by preventing the loading of a last of a plurality of registers while the first port is accessing the memory array.

7. The method of claim 3 wherein the second port comprises a plurality of registers and the loading of the loading of a last of the registers is prevented in response to the second control signal.

8. A network bridge apparatus comprising:

a dual port CAM and a bridge processor, said dual port CAM including a first port coupled to a computer network, a second port coupled to said bridge processor, a memory array coupled to said first port and said second port, and a port arbiter coupled to the memory array for controlling access to said memory array by granting priority to said first port over said second port when access by said bridge processor cannot be completed before said computer network is to access to said memory array.

9. The network bridge apparatus of claim 8 wherein the port arbiter of said dual port CAM comprises:

(a) a first state machine for generating a lock signal indicating the computer network is to access to the memory array; and (b) a second state machine for preventing access to the memory array by the bridge processor in response to an active lock signal.

10. The network bridge apparatus of claim 9 wherein the bridge processor responds to an active wait signal generated by said second state machine of said dual port CAM by not loading the second port of said dual port CAM.

11. The network bridge apparatus of claim 8 wherein the port arbiter of said dual port CAM comprises a programmable logic array.

12. The network bridge apparatus of claim 9 wherein the second state machine prevents access to the memory array by the second device by bringing a wait signal active.

13. The network bridge apparatus of claim 12 wherein the second device responds to an active wait signal by not loading the second port.

14. The network bridge apparatus of claim 13 further comprising:
   a priority register coupled to the first port and to the memory array; and
   a non-priority register coupled to the second port and to the memory array.

15. The network bridge apparatus of claim 8 wherein the first and second ports each comprise data storage circuitry.

16. The network bridge apparatus of claim 15 wherein the data storage circuitry comprises a plurality of registers.

17. The network bridge apparatus of claim 16 wherein the port arbiter comprises circuitry configured to prevent the loading of a last of the registers which comprise the second port while the first port is accessing the memory array.

18. The network bridge apparatus of claim 8 further comprising:
   a priority register coupled to the first port and to the memory array; and
   a non-priority register coupled to the second port and to the memory array.

19. A content addressable memory (CAM) chip comprising:
   a first port for storing information from a first device;
   a second port for storing information from a second device;
   a memory array coupled to the first port and the second port;
   an internal port arbiter coupled to the memory array for controlling access to the memory array by ranting priority of access to the memory array to the first port over the second port wherein the internal port arbiter comprises:
   a first state machine for generating a lock signal indicating the first device is to access to the memory array; and
   a second state machine for interrupting access to the memory array by the second device in response to an active lock signal,
   wherein the second state machine prevents access to the memory array by the second device by bringing a wait signal active and the second device responds to an active wait signal by not loading a last of a plurality of registers which comprise the second port.

20. A content addressable memory (CAM) comprising a first port for storing information from a first device; a second port for storing information from a second device, the first and second ports comprising data storage circuitry including a plurality of registers; a memory array coupled to the first port and the second port; and a port arbiter coupled to the memory array and comprising circuitry configured to grant priority to the first port over the second port for accessing the memory array and to prevent the loading of a last of the registers which comprise the second port while the first port is accessing the memory array.

21. The CAM of claim 20 wherein the port arbiter comprises:
   a) a first state machine for generating a lock signal indicating the first port is to access to the memory array; and
   b) a second state machine for preventing access to the memory array by the second port in response to an active lock signal.

22. The memory of claim 21 wherein the loading of the second port is prevented in response to an active wait signal.

23. The CAM of claim 3 wherein the port arbiter comprises a programmable logic array.

24. The CAM of claim 21 wherein the plurality of registers include:
   a priority register coupled to the first port and the port arbiter for storing information from the first device;
   a non-priority register coupled to the second port and the port arbiter for storing information from the second device.

25. The CAM of claim 20 wherein the internal port arbiter comprises:
   a first state machine for generating a lock signal indicating the first device is to access to the memory array; and
   a second state machine for interrupting access to the memory array by the second device in response to an active lock signal.

26. The CAM of claim 25 wherein the port arbiter controls access to the memory array such that the first port has precedence over the second port.

* * * * *